(12) United States Patent
Wang et al.

(10) Patent No.: US 9,279,037 B2
(45) Date of Patent: Mar. 8, 2016

(54) ALKALINE SOLUBLE RESIN, PROCESS FOR PREPARING SAME, AND PHOTORESIST COMPOSITION CONTAINING SAME

(71) Applicant: BOE TECHNOLOGY GROUP CO., LTD., Beijing (CN)

(72) Inventors: Xuelan Wang, Beijing (CN); Chen Tang, Beijing (CN); Shan Chang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/239,552

(22) PCT Filed: Jul. 26, 2013

(86) PCT No.: PCT/CN2013/080171
§ 371 (c)(1),
(2) Date: Feb. 19, 2014

(87) PCT Pub. No.: WO2014/161251
PCT Pub. Date: Oct. 9, 2014

(65) Prior Publication Data
US 2015/0152210 A1    Jun. 4, 2015

(30) Foreign Application Priority Data
Apr. 3, 2013    (CN) .......................... 2013 1 0116385

(51) Int. Cl.
*C08G 81/02*    (2006.01)
*C08G 65/00*    (2006.01)
(Continued)

(52) U.S. Cl.
CPC . *C08G 81/02* (2013.01); *C08F 8/14* (2013.01); *C08F 216/06* (2013.01); *C08F 220/06* (2013.01); *C08F 220/18* (2013.01); *C08F 261/00* (2013.01); *C08F 265/02* (2013.01); *C08G 65/00* (2013.01); *C08G 65/002* (2013.01); *C08G 65/34* (2013.01); *G03F 7/004* (2013.01); *G03F 7/0048* (2013.01); *G03F 7/027* (2013.01);
(Continued)

(58) Field of Classification Search
None
See application file for complete search history.

(56) References Cited

U.S. PATENT DOCUMENTS 5,739,179 A    4/1998  Chiou et al.
6,136,506 A    10/2000  Hashimoto et al.
(Continued)

FOREIGN PATENT DOCUMENTS

CN    1134437 A    10/1996
CN    101059653 A    10/2007
(Continued)

OTHER PUBLICATIONS

International Search Report for International Application No. PCT/CN2013/080171 dated Dec. 26, 2013.
(Continued)

*Primary Examiner* — Sin Lee
(74) *Attorney, Agent, or Firm* — Ladas & Parry LLP

(57) ABSTRACT

An alkaline soluble resin, a process for preparing the same, and a photoresist composition containing the same. The alkaline soluble resin is a polyether chain-containing acrylate alkaline soluble resin. A photoresist composition comprising said alkaline soluble resin can reduce the slope angle of the film layer and prevent gaps which cause light leakage from forming in the junction between the colored film layer and the black matrix. Moreover, the coating and the rubbing effect of the orientation layer can be improved.

16 Claims, 5 Drawing Sheets

(51) Int. Cl.
  *G03F 7/038* (2006.01)
  *G03F 7/028* (2006.01)
  *G03F 7/30* (2006.01)
  *G03F 7/033* (2006.01)
  *G03F 7/004* (2006.01)
  *C08G 65/34* (2006.01)
  *C08F 220/06* (2006.01)
  *C08F 220/18* (2006.01)
  *C08F 265/02* (2006.01)
  *G03F 7/027* (2006.01)
  *C08F 216/06* (2006.01)
  *C08F 8/14* (2006.01)
  *C08F 261/00* (2006.01)
  *C08F 222/10* (2006.01)

(52) U.S. Cl.
  CPC ............ *G03F 7/028* (2013.01); *G03F 7/033* (2013.01); *G03F 7/0388* (2013.01); *G03F 7/30* (2013.01); *C08F 2222/104* (2013.01); *C08F 2222/1013* (2013.01)

(56) References Cited

U.S. PATENT DOCUMENTS

| 9,006,352 | B2* | 4/2015 | Li et al. .................... 525/471 |
| 2010/0081089 | A1 | 4/2010 | Kim et al. |
| 2010/0222473 | A1* | 9/2010 | Youn et al. ................. 524/105 |
| 2014/0051814 | A1 | 2/2014 | Li et al. |

FOREIGN PATENT DOCUMENTS

| CN | 101134800 A | 3/2008 |
| CN | 101290473 A | 10/2008 |
| CN | 102786631 A | 11/2012 |
| KR | 20080092302 A | 10/2008 |

OTHER PUBLICATIONS

First Office Action issued by the Chinese Patent Office for Chinese Patent Application No. 201310116385.3 dated Aug. 15, 2014, 6pgs.
English translation of First Office Action issued by the Chinese Patent Office for Chinese Patent Application No. 201310116385.3 dated Aug. 15, 2014, 3pgs.
Korean Notice of Allowance Appln. Nio. 10-2013-0096408; Dated Aug. 11, 2015.
International Preliminary Report on Patentability Appln. No. PCT/CN2013/080171; Dated Oct. 6, 2015.
USPTO Restriction Requirement Mailed Sep. 5, 2014 (for U.S. Appl. No. 13/968,106).
USPTO Notice of Allowance Mailed Nov. 14, 2014 (for U.S. Appl. No. 13/968,106).
Korean Office Action Appln. No. 10-2013-0096408; Dated Jan. 26, 2015.
First Chinese Office Action Appln. No. 201210292588.3; Dated Oct. 29, 2013.
Extended European Search Report Appln. No. 13180410.6-1304; Dated Nov. 13, 2013.

* cited by examiner

ALKALINE SOLUBLE RESIN, PROCESS FOR PREPARING SAME, AND PHOTORESIST COMPOSITION CONTAINING SAME

CROSS REFERENCE TO RELATED APPLICATIONS

This application is based on International Application No. PCT/CN2013/080171 filed on Jul. 26, 2013, which claims priority to Chinese National Application No. 201310116385.3 filed on Apr. 3, 2013, the contents of which are incorporated herein by reference.

FIELD OF INVENTION

Embodiments of the invention relate to an alkaline soluble resin, a process for preparing the same, and a photoresist composition containing the same.

BACKGROUND OF INVENTION

A colored filter is primarily composed of a substrate, a black matrix, a colored film layer, a protective layer and a conductive layer. Usually, a colored photoresist composition is applied to a substrate to form a photoresist layer, a predetermined photoresist pattern is formed after exposure of the photoresist layer, and the photoresist pattern is developed and post-baked to obtain the colored film layer.

In a colored filter, there are requirements on the slope angle of the aforesaid film layer. If the slope angle is too large, it is prone to leaking light. The slope angle of a film layer primarily depends on the film forming property of the photoresist composition. The major components of a photoresist composition include an alkaline soluble resin, a photoactive compound, a photoinitiator, a pigment dispersion solution, an organic solvent as well as other additives. After exposure and experiencing a high temperature post-baking, the photoactive compound will form a polymer. Some polymers have high hardness and are not easy to be bent to form a gradient, causing a large slope angle of the film layer. Therefore, gaps may form in the junction between the colored film layer and the black matrix, thereby causing light leakage. Moreover, a large slope angle affects the coating and the rubbing effect of the orientation layer in the liquid crystal glass box in subsequent process, which may also cause light leakage. It may even affect the orientation of liquid crystals, thereby affecting the display quality of the images. It thus becomes a concern to keep the slope angle of the colored film layer within a proper range (23°-60°) in the research and development of a photoresist composition.

SUMMARY OF INVENTION

An embodiment of the invention provides an alkaline soluble resin, wherein the alkaline soluble resin is a polyether chain-containing acrylate alkaline soluble resin obtained from grafting an acrylate alkaline soluble resin with a polyether chain-containing monoacid.

For example, the polyether chain-containing monoacid has the following structural formula:

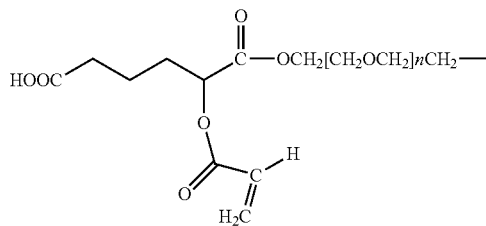

wherein n is an integer of 7-30.

For example, said acrylate alkaline soluble resin may include any one of methacrylates, amine modified acrylates, acrylate alkaline soluble resins with polycyclic aromatic side chains, and highly branched alkaline soluble acrylated polyesters.

For example, said alkaline soluble resin contains less than 100 carbon atoms.

An embodiment of the invention further provides a process for preparing the alkaline soluble resin, comprising:

1) reacting adipic acid with 1,3-dibromo-5,5-dimethylhydantoin in dichloromethane to obtain 1-bromohexanoic acid; reacting 1-bromohexanoic acid with sodium hydroxide to obtain sodium 1-hydroxyhexanoate; and reacting sodium 1-hydroxyhexanoate with acryloyl chloride to obtain an active adipate;

2) reacting polyethylene glycol and the active adipate in N,N-dimethylformamide to obtain a polyether chain-containing monoacid;

3) reacting the polyether chain-containing monoacid and an acrylate alkaline soluble resin in N,N-dimethylformamide to obtain a polyether chain-containing acrylate alkaline soluble resin.

For example, the ratio of polyethylene glycol to the active adipate in parts by weight in step 2 may be in the range of 1:0.5 to 1:0.95.

For example, the ratio of the polyether chain-containing monoacid and the acrylate alkaline soluble resin in parts by weight in step 3 may be in the range of 1:0.45 to 1:0.83.

An embodiment of the invention further provides a photoresist composition, wherein said photoresist composition comprises the aforesaid alkaline soluble resin.

For example, said photoresist composition may comprise the following components by weight percentage:
alkaline soluble resin: 7%-24%;
photoactive compound: 10%-22%;
photoinitiator: 1.3%-12.5%.

For example, said photoinitiator may include one or more of benzoins, benzophenones, and anthraquinones.

For example, said photoactive compound may include one or more of dipentaerythritol pentaacrylate, dipentaerythritol hexaacrylate, pentaerythritol tetraacrylate, and ethoxylated pentaerythritol tetraacrylate.

For example, said photoresist composition may further include solvent components, wherein said solvent include one or more of propanedione methyl ether acetate, propylene glycol diacetate, ethyl 3-ethoxy-3-iminopropionate, 2-methyl-heptane, 3-methyl-heptane, cyclopentanone, and cyclohexanone.

DESCRIPTION OF DRAWINGS

In order to more clearly illustrate the technical solutions of the embodiments of the invention or the prior art, the figures useful for the description of the embodiments of the present invention and the prior art are briefly introduced below.

Apparently, the figures in the following description are merely some embodiments of the invention. To a person of ordinary skill in the art, other figures can be obtained based on these figures without resorting to any inventive work.

DETAILED DESCRIPTION OF INVENTION

Figure 1:
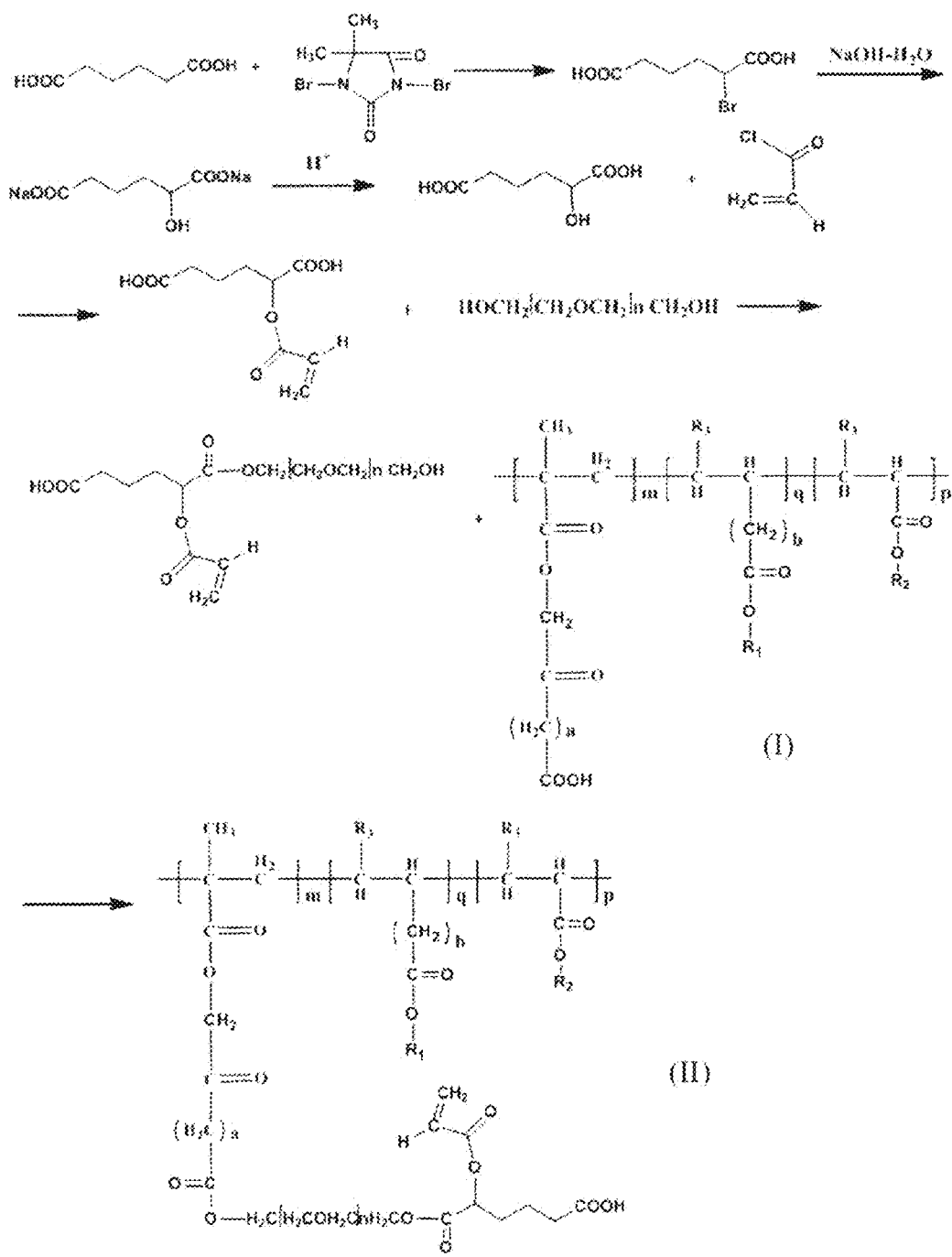
FIG. 1 is the flow chart of the process for preparing the alkaline soluble resin in Example 1 of the invention.

In order to allow a person skilled in the art to better understand the technical solution of the invention, the invention will be described in further details with reference to the figures and specific embodiments. Apparently, the embodiments described herein are merely some, rather than all embodiments of the invention. Any other embodiment obtained by a person of ordinary skill in the art on the basis of the embodiments of the invention without paying inventive work will fall into the scope of the invention.

The embodiment of the invention provides an alkaline soluble resin, wherein the alkaline soluble resin is a polyether chain-containing acrylate alkaline soluble resin obtained from grafting an acrylate alkaline soluble resin with a polyether chain-containing monoacid.

For example, the polyether chain-containing monoacid has the following structural formula:

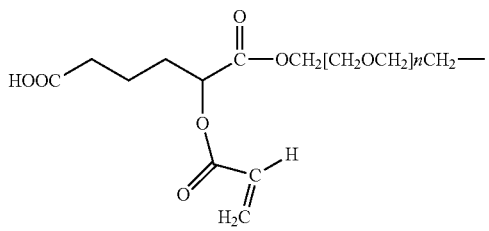

wherein n is an integer of 7-30.

For example, said acrylate alkaline soluble resin may include any one of methacrylates, amine modified acrylates, acrylate alkaline soluble resins with polycyclic aromatic side chains, and highly branched alkaline soluble acrylated polyesters. Said alkaline soluble resin contains less than 100 carbon atoms.

When the acrylate alkaline soluble resin grafted with polyether chain of the invention is added to the photoresist composition, the alkaline soluble resin bearing double bonds will participate in the polymerization reaction upon exposure and post-baking, thereby forming a more compact flexible network. Meanwhile, it remains soft after post-baking at high temperature. Because the ether linkage in the alkaline soluble resin has a small potential barrier to internal rotation and a good dynamic flexibility, it readily leads other components of the photoresist to bend, sag and flow naturally under gravity, thereby forming a smaller slope. The colored film layer prepared from the photoresist composition containing said alkaline soluble resin will have a small slope angle which can be controlled within a range of 25°-55°, thereby preventing gaps which cause light leakage from forming in the junction between the colored film layer and the black matrix. Moreover, the photoresist composition of the embodiment of the invention has improved the coating and the rubbing effect of the orientation layer in the liquid crystal glass box in subsequent process, which improves the orientation of the liquid crystals, thereby increasing the display quality of the images.

The embodiment of the invention further provides a process for preparing the aforesaid alkaline soluble resin which comprises the following steps.

1) Preparation of an Active Adipate

Adipic acid is reacted with 1,3-dibromo-5,5-dimethylhydantoin in dichloromethane to obtain 1-bromohexanoic acid; 1-bromohexanoic acid is reacted with sodium hydroxide to obtain sodium 1-hydroxyhexanoate; and sodium 1-hydroxyhexanoate is reacted with acryloyl chloride to obtain an active adipate.

2) Preparation of a Polyether Chain-Containing Monoacid

Polyethylene glycol is reacted with the active adipate in N,N-dimethylformamide to obtain a polyether chain-containing monoacid;

3) Preparation of a Polyether Chain-Containing Acrylate Alkaline Soluble Resin

The polyether chain-containing monoacid is reacted with an acrylate alkaline soluble resin in N,N-dimethylformamide to obtain a polyether chain-containing acrylate alkaline soluble resin.

The ratio of the polyethylene glycol to the active adipate in parts by weight in step 2 is in the range of 1:0.5 to 1:0.95. The ratio of the polyether chain-containing monoacid and the acrylate alkaline soluble resin in parts by weight in step 3 is in the range of 1:0.45 to 1:0.83.

The embodiment of the invention further provides a photoresist composition comprising the aforesaid alkaline soluble resin.

Said photoresist composition comprises the following components by weight percentage:
alkaline soluble resin: 7%-24%;
photoactive compound: 10%-22%;
photoinitiator: 1.3%-12.5%.

The photoactive compound suitable for the invention may be any photoactive compound known by a person skilled in the art for this purpose. For example, the photoactive compound may include one or more of dipentaerythritol pentaacrylate, dipentaerythritol hexaacrylate, pentaerythritol tetraacrylate, and ethoxylated pentaerythritol tetraacrylate.

The photoinitiator suitable for the invention may be any photoinitiator known by a person skilled in the art for this purpose. For example, the photoinitiator may include one or more of benzoins, benzophenones, and anthraquinones.

The photoresist composition may further include solvent components. There is no particular limitation to the solvent, as long as it can dissolve or disperse the components of the photoresist composition, does not react with the aforesaid components, and has suitable volatility. For example, the solvent may be one or more of propanedione methyl ether acetate, propylene glycol diacetate, ethyl 3-ethoxy-3-iminopropionate, 2-heptane, 3-heptane, cyclopentanone, and cyclohexanone. The solvent may be present at a level of 3%-21% by weight of the photoresist composition.

In addition to the aforesaid substances, the photoresist composition prepared according to the embodiments of the invention may further comprises many other optional components, such as, a pigment dispersion solution, and other additives such as a coupling agent, an antioxidant, an ultraviolet diluent, or a cross-linking agent. Upon reading the present specification, a person skilled in the art can readily determine a certain optional component or certain optional components and contents thereof, for meeting a specific application. For example, a pigment dispersion solution may be present at a level of about 40%-70%, such as about 48%-69%, by weight of the photoresist composition. An additive may be present at a level of about 0.05%-1.5%, such as about 0.07%-1.0%, by weight of the photoresist composition.

For example, the photoresist composition may comprise the following components by weight percentage:
alkaline soluble resin: 7%-24%;
photoactive compound: 10%-22%;
photoinitiator: 1.3%-12.5%;
pigment dispersion solution: 48%-69%;
solvent: 3%-21%; and
additive: 0.07%-1.0%.

The additive may be added according to need, for example, a coupling agent, an antioxidant, an ultraviolet diluent, a cross-linking agent, a leveling agent, or other adjuvants, etc., which are not individually enumerated here.

In order to better illustrate the aforesaid alkaline soluble resin, a process for preparing the same, and a photoresist composition containing the same, detailed illustration is provided below by way of several specific examples. It should be understood that these examples are merely illustrative, and in no way limit the scope of the invention.

Example 1

The example provides an alkaline soluble resin, a process for preparing the same, and a photoresist composition containing the same.

The process for preparing the alkaline soluble resin is described below (flow chart for the process of preparation is shown in FIG. 1):

1.1) Preparation of an Active Adipate 1 part by weight of adipic acid, 0.5 parts by weight of 1,3-dibromo-5,5-dimethylhydantoin, and 50 parts by weight of dichloromethane (solvent) are added into a 100 mL round bottom flask, and reacted for 2.5 h with stirring at room temperature. After the completion of the reaction, the mixture was filtered and the filtrate was washed with 40 parts by weight of water for 3 times. The organic phases were combined and dried over anhydrous sodium sulfate to obtain 1-bromoadipic acid.

1 part by weight of 1-bromoadipic acid was added to 2.3 parts by weight of 30% sodium hydroxide solution, and heated to 100° C. for 4 h. The reaction was extracted with 50 parts by weight of dichloromethane (solvent) for 3 times. The organic phase was dried over anhydrous sodium sulfate to obtain sodium 1-hydroxyadipate.

1 part by weight of sodium 1-hydroxyadipate was added to 2.56 parts by weight of 20% sulfuric acid solution, and heated to 100° C. for 3 h. The reaction was extracted with 50 parts by weight of dichloromethane (solvent) for 3 times. The organic phase was dried over anhydrous sodium sulfate to obtain 1-hydroxyadipic acid.

2 parts by weight of 1-hydroxyadipic acid and 0.6 parts by weight of acryloyl chloride were added to a three-necked bottle. A suitable amount of tetrahydrofuran was added, and under ice bath, a suitable amount of triethylamine catalyst was added, heated to 70° C., and refluxed overnight under nitrogen atmosphere. After the completion of the reaction, the solvent was removed by evaporation under reduced pressure, and isolated using high pressure liquid chromatography for further removing the solvent. The solid was re-crystallized using cyclohexane, filtered, and dried under vacuum to obtain an active adipate. The active adipate has the following NMR data: $^1$H NMR (300 MHz, CDCl$_3$, ppm) δ: 2.11-2.72 (m, 6H), 3.82 (s, 1H), 4.06 (s, 1H), 4.89 (s, 2H), 5.3 (s, 1H), 11.8 (s, 2H).

1.2) Preparation of a Polyether Chain-Containing Monoacid

Figure 2:
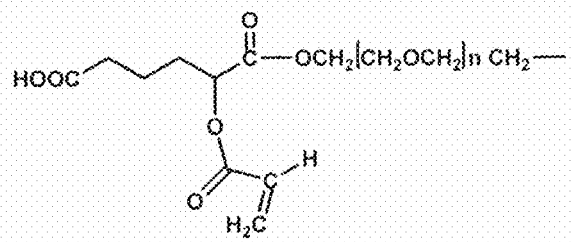
FIG. 2 shows the structure of the grafted polyether chain in Example 1 of the invention.

Polyethylene glycol 400, the active adipate, and N,N-dimethylformamide (DMF) as the solvent were added to a round bottom flask (the weight ratio of the three components is shown in Table 1) and refluxed at 80° C. for 6 h. After the completion of the reaction and cooling, DMF was removed by evaporation under reduced pressure. The resulting product was dropwise added to 30 parts by weight of acetone and washed three times as described above to obtain a white solid, which was dried under vacuum to obtain a polyether chain-containing monoacid, wherein the structural formula of the polyether chain is shown in FIG. 2.

1.3) Preparation of the Polyether Chain-Containing Acrylate Alkaline Soluble Resin Firstly, the highly branched alkaline soluble acrylated polyester used in the example has the structure as shown in the following formula (I):

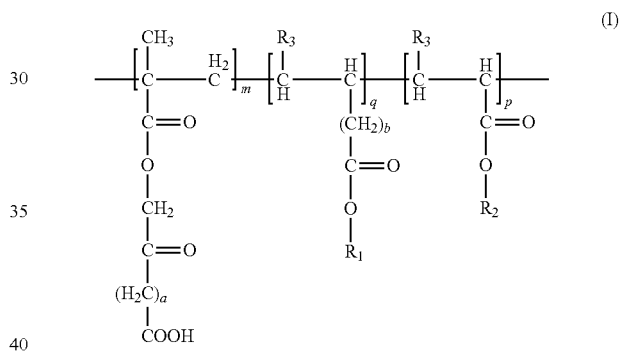

wherein R$_1$ is methyl or ethyl; R$_2$ is any one of methyl, ethyl, phenyl, naphthyl, multicyclic aryl, methylamino, and hydrazino; R$_3$ is hydrogen or methyl; m, q, and p are integers within the range of 9-15; and a and b are integers within the range of 1-5.

The polyether chain-containing monoacid prepared in 1.2), the highly branched alkaline soluble acrylated polyester (I) and N,N-dimethylformamide (DMF) as the solvent were added to a round bottom flask (the weight ratio of the three components is shown in Table 1) and a suitable amount of concentrated sulfuric acid was added as the catalyst, and the mixture was refluxed at 135° C. for 12 h. After the completion of the reaction and cooling, DMF was removed by evaporation under reduced pressure. The resulting product was dropwise added to 50 parts by weight of cyclohexanone and washed three times as described above and dried under vacuum to obtain a white solid, that is, the alkaline soluble resin, of which the structural formula (II) is shown in FIG. 1, wherein R$_1$ is methyl or ethyl; R$_2$ is any one of methyl, ethyl, phenyl, naphthyl, multicyclic aryl, methylamino, and hydrazino; R$_3$ is hydrogen or methyl; m, q, and p are integers within the range of 9-15; and a and b are integers within the range of 1-5.

Preparation of the Photoresist Composition

The photoresist composition was prepared based on the components and amounts shown in Table 1. The components were thoroughly agitated to form the photoresist composition, which was coated on a glass substrate with a black matrix and labeled as sample 1, in a thickness of 2.6 micron. The glass substrate was baked in an oven at 80-110° C. for 3 min. After exposure treatment with an ultraviolet light at an illumination of 125 mJ/cm$^2$, it was developed for 30 s in a developing solution at room temperature. After being cleaned with deionized water, the glass substrate was blown to dryness, and baked at 230° C. for 45 min.

Figure 3:
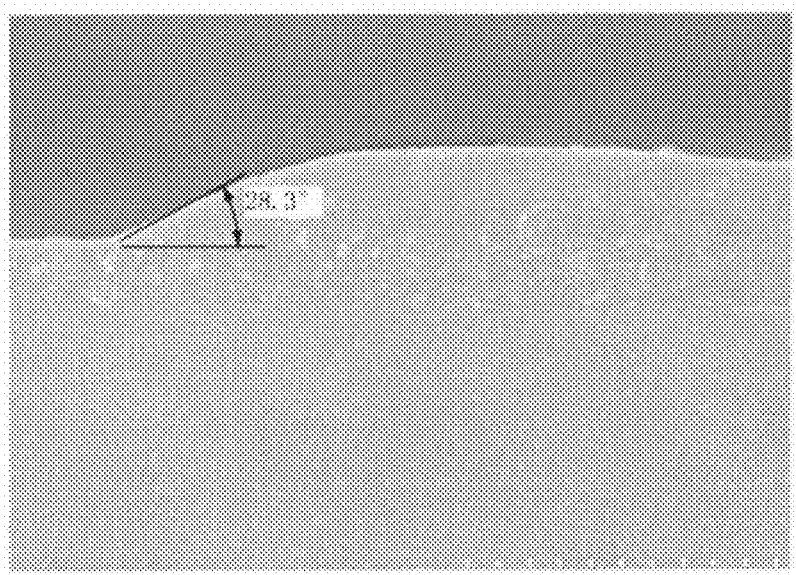
FIG. 3 is the schematic diagram of the slope angle of the colored film layer prepared in Example 1 of the invention.

The glass was sliced and made into a sample. The cross section thereof was examined with a scanning electron microscope and the slope was observed. The results are shown in FIG. 3 with a slope angle of 28.3°. It can be seen that the slope angle of the film layer is small and thus can effectively avoid light leakage.

Example 2

The example provides an alkaline soluble resin, a process for preparing the same, and a photoresist composition containing the same.

The process for preparing the alkaline soluble resin is described below:

2.1) Preparation of an Active Adipate

The method for preparing the active adipate is the same as that in Example 1.

2.2) Preparation of a Polyether Chain-Containing Monoacid

Polyethylene glycol 800, the active adipate, and N,N-dimethylformamide (DMF) as the solvent were added to a round bottom flask (the weight ratio of the three components is shown in Table 1) and refluxed at 120° C. for 10 h. After the completion of the reaction and cooling, DMF was removed by evaporation under reduced pressure. The resulting product was dropwise added to 100 parts by weight of acetone and washed three times as described above to obtain a white solid, which was dried under vacuum to obtain a polyether chain-containing monoacid, wherein the structural formula of the polyether chain is shown in FIG. 2.

2.3) Preparation of a Polyether Chain-Containing Acrylate Alkaline Soluble Resin The polyether chain-containing monoacid prepared in 2.2), an amine modified epoxyacrylate (UV1101, Shanghai Xinmao, Chemical & Trading Co. Ltd.) and the N,N-dimethylformamide (DMF) as the solvent were added to a round bottom flask (the weight ratio of the three components is shown in Table 1) and a suitable amount of concentrated sulfuric acid was added as the catalyst, and the mixture was refluxed at 180° C. for 18 h. After the completion of the reaction and cooling, DMF was removed by evaporation under reduced pressure. The resulting product was dropwise added to 150 parts by weight of cyclohexanone and washed three times as described above and dried under vacuum to obtain a white solid, that is, the alkaline soluble resin.

Preparation of the Photoresist Composition

The photoresist composition was prepared based on the components and amounts shown in Table 1. The components were thoroughly agitated to form the photoresist composition, which was coated on a glass substrate with a black matrix and labeled as sample 2, in a thickness of 2.6 micron. The glass substrate was baked in an oven at 80-110° C. for 3 min. After exposure treatment with an ultraviolet light at an illumination of 125 mJ/cm$^2$, it was developed for 30 s in a developing solution at room temperature. After being cleaned with deionized water, the glass substrate was blown to dryness, and baked at 230° C. for 45 min.

Figure 4:
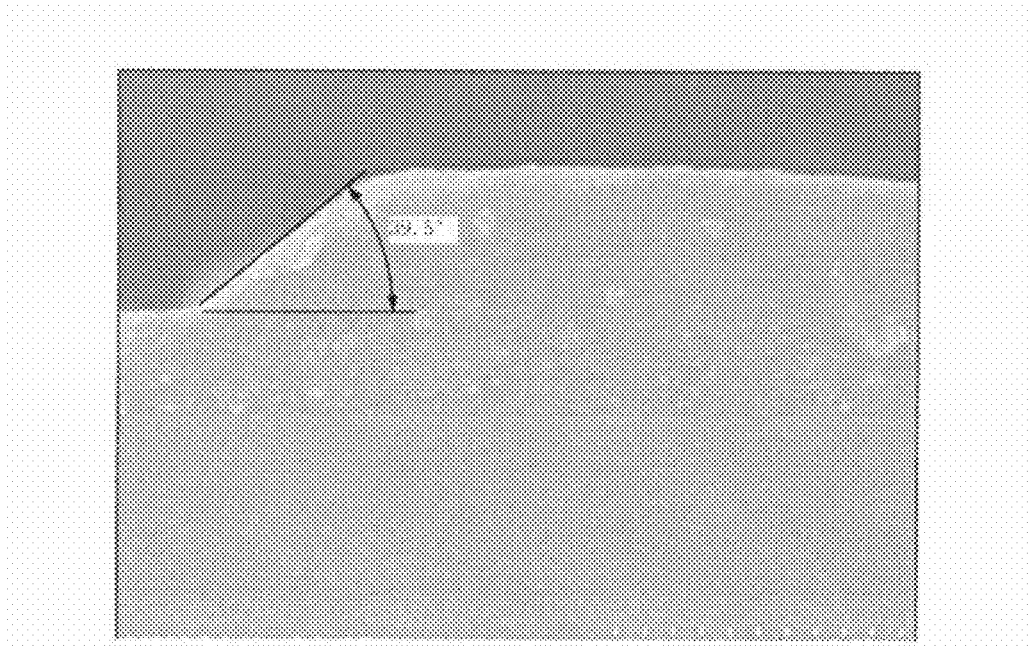
FIG. 4 is the schematic diagram of the slope angle of the colored film layer prepared in Example 2 of the invention.

The glass was sliced and made into a sample. The cross section thereof was examined with a scanning electron microscope (SEM) and the slope was observed. The results are shown in FIG. 4 with a slope angle of 39.5°. It can be seen that the slope angle of the film layer is small and thus can effectively avoid light leakage.

Example 3

The example provides an alkaline soluble resin, a process for preparing the same, and a photoresist composition containing the same.

The process for preparing the alkaline soluble resin is described below:

3.1) Preparation of an Active Adipate

The method for preparing the active adipate is the same as that in Example 1.

3.2) Preparation of a Polyether Chain-Containing Monoacid

Polyethylene glycol 1200, the active adipate, and N,N-dimethylformamide (DMF) as the solvent were added to a round bottom flask (the weight ratio of the three components is shown in Table 1) and refluxed at 100° C. for 6-10 h. After the completion of the reaction and cooling, DMF was removed by evaporation under reduced pressure. The resulting product was dropwise added to 70 parts by weight of acetone and washed three times as described above to obtain a white solid, which was dried under vacuum to obtain a polyether chain-containing monoacid, wherein the structural formula of the polyether chain is shown in FIG. 2.

3.3) Preparation of a Polyether Chain-Containing Acrylate Alkaline Soluble Resin The polyether chain-containing monoacid prepared in 3.2), aromatic acid methacrylate hemiester (SB401, Sartomer (Guangzhou) Chemical Co. Ltd.) and N,N-dimethylformamide (DMF) as the solvent were added to a round bottom flask (the weight ratio of the three components is shown in Table 1) and a suitable amount of concentrated sulfuric acid was added as the catalyst, and the mixture was refluxed at 150° C. for 15 h. After the completion of the reaction and cooling, DMF was removed by evaporation under reduced pressure. The resulting product was dropwise added to 100 parts by weight of cyclohexanone and washed three times as described above and dried under vacuum to obtain a white solid, that is, the alkaline soluble resin.

Preparation of the Photoresist Composition

The photoresist composition was prepared based on the components and amounts shown in Table 1. The components were thoroughly agitated to form the photoresist composition which was coated on a glass substrate with a black matrix and labeled as sample 3, in a thickness of 2.6 micron. The glass substrate was baked in an oven at 80-110° C. for 3 min. After exposure treatment with an ultraviolet light at an illumination of 125 mJ/cm$^2$, it was developed for 30 s in a developing solution at room temperature. After being cleaned with deionized water, the glass substrate was blown to dryness, and baked at 230° C. for 45 min.

Figure 5:
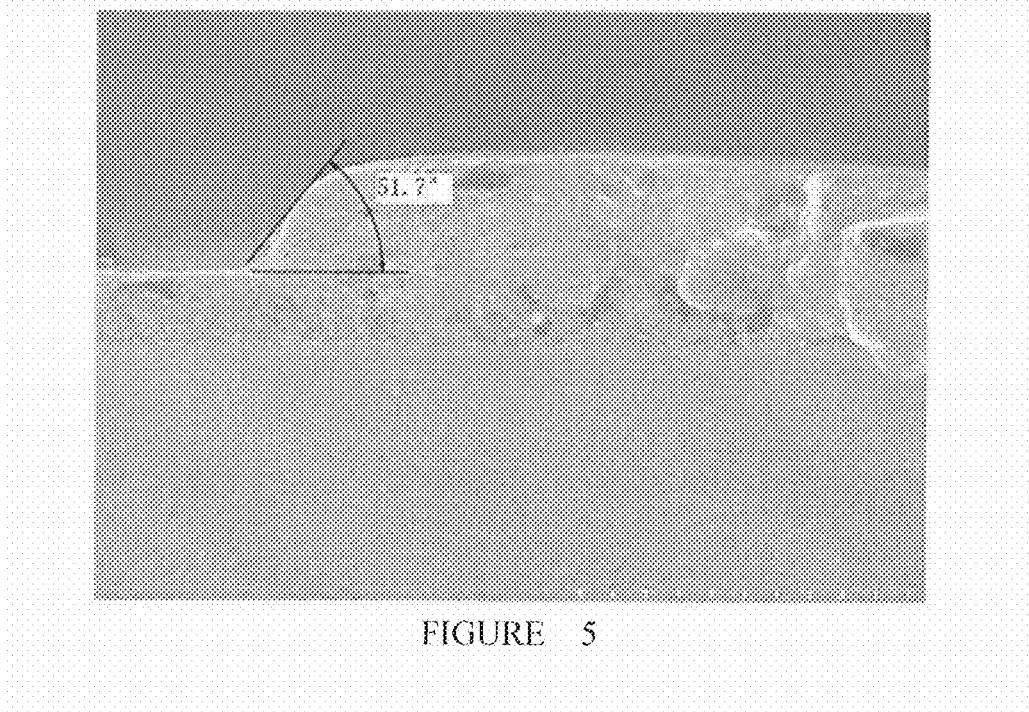
FIG. 5 is the schematic diagram of the slope angle of the colored film layer prepared in Example 3 of the invention.

The glass was sliced and made into a sample. The cross section thereof was examined with a scanning electron microscope (SEM) and the slope was observed. The results are shown in FIG. 5 with a slope angle of 51.7°. It can be seen that the slope angle of the film layer is small and thus can effectively avoid light leakage.

Example 4

The example provides an alkaline soluble resin, a process for preparing the same, and a photoresist composition containing the same.

The process for preparing the alkaline soluble resin is described below:

4.1) Preparation of an Active Adipate

The method for preparing the active adipate is the same as that in Example 1.

4.2) Preparation of a Polyether Chain-Containing Monoacid

Polyethylene glycol 400, the active adipate, and N,N-dimethylformamide (DMF) as the solvent were added to a round bottom flask (the weight ratio of the three components is shown in Table 1) and refluxed at 90° C. for 7 h. After the completion of the reaction and cooling, DMF was removed by evaporation under reduced pressure. The resulting product was dropwise added to 80 parts by weight of acetone and washed three times as described above to obtain a white solid, which was dried under vacuum to obtain a polyether chain-containing monoacid, wherein the structural formula of the polyether chain is shown in FIG. 2.

4.3) Preparation of a Polyether Chain-Containing Acrylate Alkaline Soluble Resin The polyether chain-containing monoacid prepared in 4.2), methacrylate, and N,N-dimethylformamide (DMF) as the solvent were added into a round bottom flask (the weight ratio of the three components is shown in Table 1) and a suitable amount of concentrated sulfuric acid was added as the catalyst, and the mixture was refluxed at 160° C. for 14 h. After the completion of the reaction and cooling, DMF was removed by evaporation under reduced pressure. The resulting product was dropwise added to 80 parts by weight of cyclohexanone and washed three times as described above and dried under vacuum to obtain a white solid, that is, the alkaline soluble resin.

Preparation of the Photoresist Composition

The photoresist composition was prepared based on the components and amounts shown in Table 1. The components were thoroughly agitated to form the photoresist composition, which was coated on a glass substrate with a black matrix and labeled as sample 4, in a thickness of 2.6 micron. The glass substrate was baked in an oven at 80-110° C. for 3 min. After exposure treatment with an ultraviolet light at an illumination of 125 mJ/cm$^2$, it was developed for 30 s in a developing solution at room temperature. After being cleaned with deionized water, the glass substrate was blown to dryness, and baked at 230° C. for 45 min.

Figure 6:
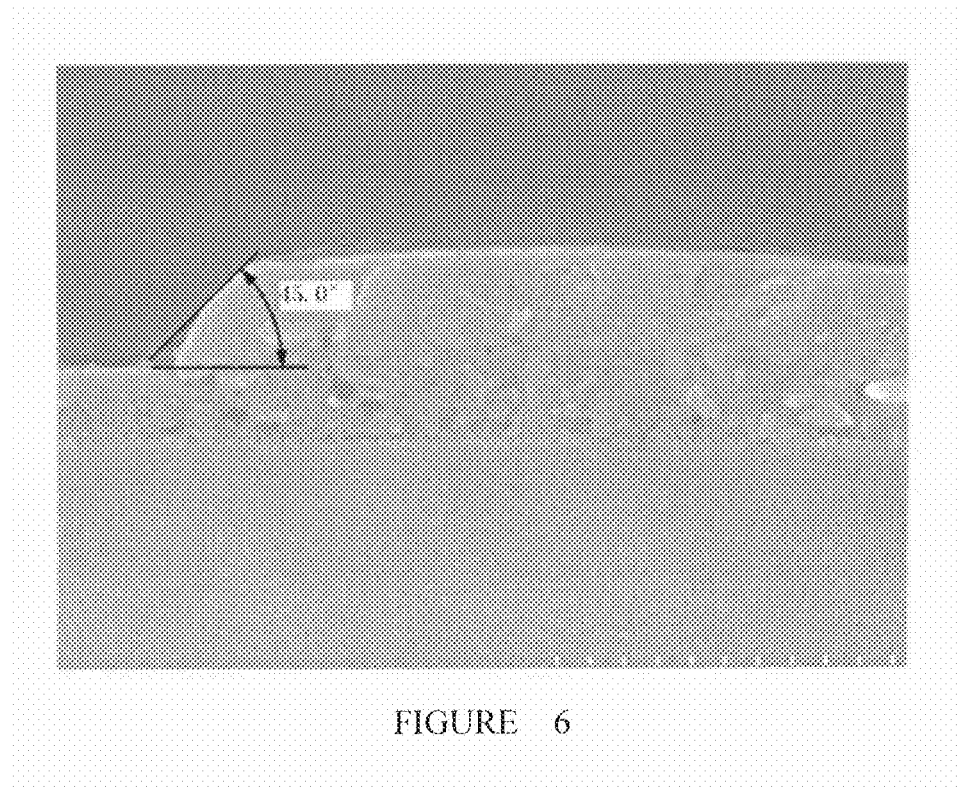
FIG. 6 is the schematic diagram of the slope angle of the colored film layer prepared in Example 4 of the invention.

The glass was sliced and made into a sample. The cross section thereof was examined with a scanning electron microscope (SEM) and the slope was observed. The results are shown in FIG. 6 with a slope angle of 45.0°. It can be seen that the slope angle of the film layer is small and thus can effectively avoid light leakage.

Comparative Example

Figure 7:
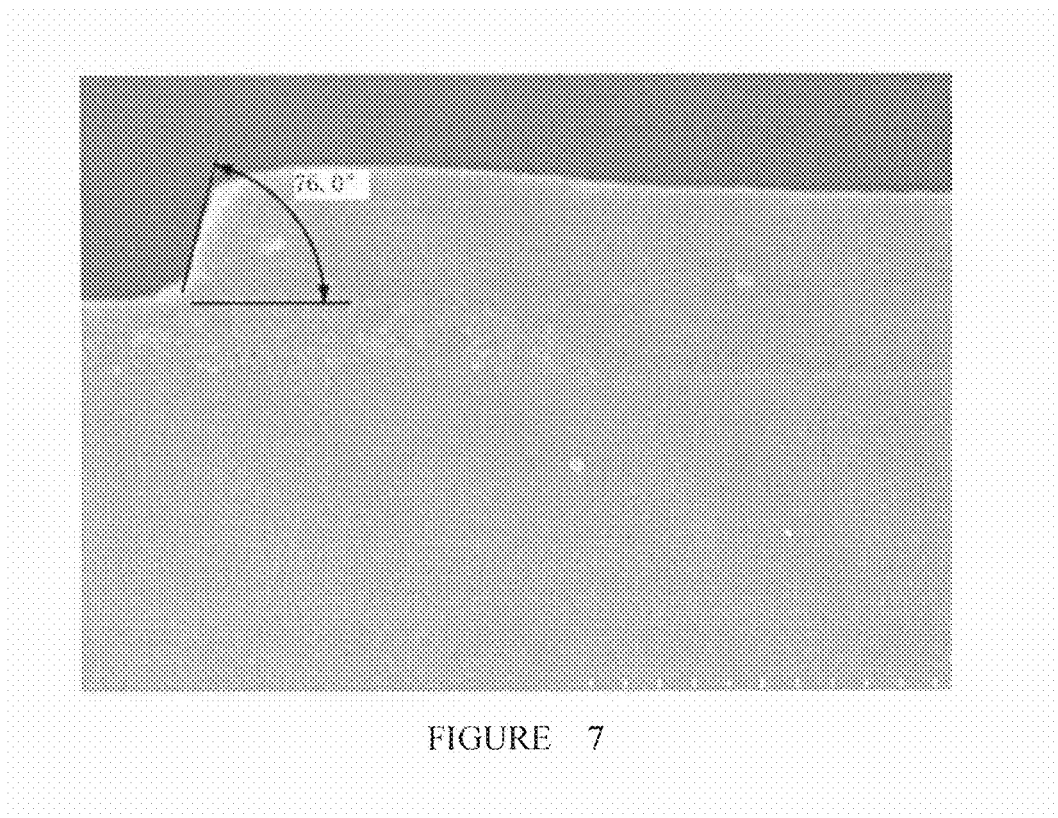
FIG. 7 is the schematic diagram of the slope angle of the colored film layer prepared in the Comparative Example.

The photoresist composition is the same as that in Example 4, except that the alkaline soluble resin of Example 4 was replaced by the same weight percentage of the acrylate alkaline soluble resin. The photoresist composition was coated on a glass substrate with a black matrix and labeled as sample 5, in a thickness of 2.6 micron. Other procedures were the same as those in Example 4. The results are shown in FIG. 7 with a slope angle of 76.0°. It can be seen that the slope angle of the film layer is large and is prone to leaking light.

TABLE 1 the weight ratio of the various substances in the examples of the invention and the components and weight percentages thereof in the photoresist composition

| | | Example 1 | Example 2 | Example 3 | Example 4 |
|---|---|---|---|---|---|
| Weight Ratio of Various Reactants and Solvents in Examples | Polyethylene glycol:Active adipate:N,N-dimethyl-formamide solvent | 1:0.6:50 | 1:0.5:80 | 1:0.95:30 | 1:0.8:70 |
| | polyether chain-containing monoacid:acrylate alkaline soluble resin:N,N-dimethyl-formamide solvent | 1:0.5:45 | 1:0.6:150 | 1:0.45:40 | 1:0.83:80 |
| Types of acrylate alkaline soluble resin used in Examples | | Highly branched alkaline soluble acrylated polyester | Amine modified epoxy acrylate | aromatic acid methacrylate hemiester | methacrylate |
| Weight percentage of the components of the photoresist composition (wt %) | alkaline soluble resin | 7 | 12 | 24 | 15 |
| | photoactive compound | dipentaerythritol pentaacrylate, 15 | pentaerythritol tetraacrylate, 22 | ethoxylated pentaerythritol tetraacrylate, 10 | dipentaerythritol hexaacrylate, 18 |
| | photoinitiator | benzoic acid, 8 | benzophenone, 1.3 | anthraquinones, 12.5 | bezoic acid, 4 |
| | pigment dispersion solution | 48 | 60 | 50 | 69 |
| | solvent | cyclopetanone, 21 | propylene glycol diacetate, 4.63 | 2-heptane, 3 | propanedione methyl ether acetate, 8.88 |
| | additive | siloxane coupling agent, 1 | antioxidant T501, 0.07 | dimethyl 2,2'-azo-bis(2-methylpropionate (ultraviolet absorbent), 0.5 | benzoyl peroxide (cross linking agent), 0.12 |

As can be seen above, compared to the prior photoresist composition which contains methacrylate as the alkaline soluble resin, the photoresist composition which comprises the alkaline soluble resin prepared according to examples of the invention can be made into a colored film layer with a small slope angle, thereby preventing gaps which may cause light leakage from forming in the junction between the colored film layer and the black matrix. Moreover, the photoresist composition of the invention has improved the coating and the rubbing effect of the orientation layer in the liquid crystal glass box in subsequent process, which will improve the orientation of the liquid crystals, thereby increasing the display quality of the images.

It can be appreciated that the aforesaid embodiments are merely exemplary embodiments used to illustrate the principles of the invention, but the invention is not limited to these. To a person of ordinary skill in the art, various variations and improvements can be made without departing from the spirits and essential of the invention, which are also considered as falling within the scope of the invention.

What is claimed is:

1. An alkaline soluble resin, wherein the alkaline soluble resin is a polyether chain-containing acrylate alkaline soluble resin obtained from grafting an acrylate alkaline soluble resin with a polyether chain-containing monoacid having the following structural formula:

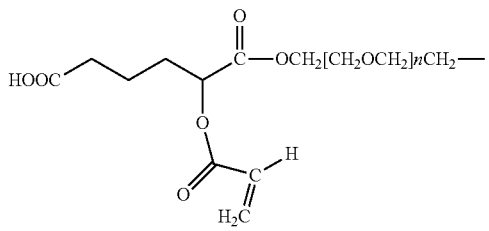

wherein n is an integer of 7-30.

2. The alkaline soluble resin according to claim 1, wherein said acrylate alkaline soluble resin comprises any one of methacrylates, amine modified acrylates, acrylate alkaline soluble resins with polycyclic aromatic side chains, and highly branched alkaline soluble acrylated polyesters.

3. The alkaline soluble resin according to claim 1, wherein said alkaline soluble resin contains less than 100 carbon atoms.

4. A process for preparing the alkaline soluble resin according to claim 1, comprising:

1) reacting adipic acid with 1,3-dibromo-5,5-dimethylhydantoin in dichloromethane to obtain 1-bromohexanoic acid; reacting 1-bromohexanoic acid with sodium hydroxide to obtain sodium 1-hydroxyhexanoate; and reacting sodium 1-hydroxyhexanoate with acryloyl chloride to obtain an active adipate;

2) reacting polyethylene glycol with the active adipate in N,N-dimethylformamide to obtain a polyether chain-containing monoacid; and 3) reacting the polyether chain-containing monoacid with an acrylate alkaline soluble resin in N,N-dimethylformamide to obtain a polyether chain-containing acrylate alkaline soluble resin.

5. The process for preparing the alkaline soluble resin according to claim 4, wherein the ratio of the polyethylene glycol to the active adipate in parts by weight in step 2 is in the range of 1:0.5 to 1:0.95.

6. The process for preparing the alkaline soluble resin according to claim 4, wherein the ratio of the polyether chain-containing monoacid to the acrylate alkaline soluble resin in parts by weight in step 3 is in the range of 1:0.45 to 1:0.83.

7. The process for preparing the alkaline soluble resin according to claim 4, wherein said polyether chain-containing monoacid has the following structural formula:

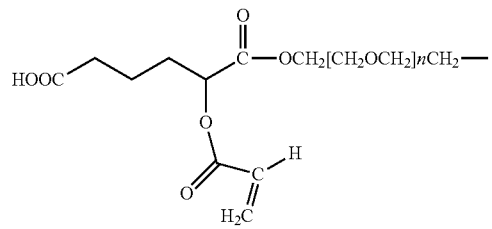

wherein n is an integer of 7-30.

8. The process for preparing the alkaline soluble resin according to claim 4, wherein said acrylate alkaline soluble resin comprises any one of methacrylates, amine modified acrylates, acrylate alkaline soluble resins with polycyclic aromatic side chains, and highly branched alkaline soluble acrylated polyesters.

9. The process for preparing the alkaline soluble resin according to claim 4, wherein said alkaline soluble resin contains less than 100 carbon atoms.

10. A photoresist composition, comprising an alkaline soluble resin, wherein the alkaline soluble resin is a polyether chain-containing acrylate alkaline soluble resin obtained from grafting an acrylate alkaline soluble resin with a polyether chain-containing monoacid having the following structural formula:

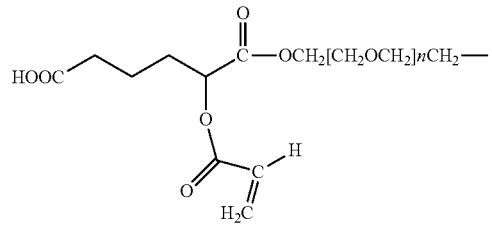

wherein n is an integer of 7-30.

11. The photoresist composition according to claim 10, wherein said photoresist composition comprises the following components by weight percentage:
alkaline soluble resin: 7%-24%;
photoactive compound: 10%-22%; and
photoinitiator: 1.3%-12.5%.

12. The photoresist composition according to claim 11, wherein the photoinitiator comprises one or more of benzoins, benzophenones, and anthraquinones.

13. The photoresist composition according to claim 11, wherein the photoactive compound comprises one or more of dipentaerythritol pentaacrylate, dipentaerythritol hexaacrylate, pentaerythritol tetraacrylate, and ethoxylated pentaerythritol tetraacrylate.

14. The photoresist composition according to claim 11, further comprising a solvent, wherein said solvent comprises one or more of propanedione methyl ether acetate, propylene glycol diacetate, ethyl 3-ethoxy-3-iminopropionate, 2-methyl-heptane, 3-methyl-heptane, cyclopentanone, and cyclohexanone.

15. The photoresist composition according to claim 10, wherein said acrylate alkaline soluble resin comprises any one of methacrylates, amine modified acrylates, acrylate alkaline soluble resins with polycyclic aromatic side chains, and highly branched alkaline soluble acrylated polyesters.

16. The photoresist composition according to claim 10, wherein said alkaline soluble resin contains less than 100 carbon atoms.

* * * * *